United States Patent [19]

Kosonocky

[11] Patent Number: 4,620,231
[45] Date of Patent: Oct. 28, 1986

[54] CCD IMAGER WITH PHOTODETECTOR BIAS INTRODUCED VIA THE CCD REGISTER

[75] Inventor: Walter F. Kosonocky, Somerset County, N.J.

[73] Assignee: RCA Corporation, Princeton, N.J.

[21] Appl. No.: 621,381

[22] Filed: Jun. 18, 1984

[51] Int. Cl.⁴ ............................................. H04N 3/14
[52] U.S. Cl. .................................................. 358/213
[58] Field of Search ............................. 358/213, 212; 357/24 LR

[56] References Cited

U.S. PATENT DOCUMENTS

| | | | |
|---|---|---|---|
| 4,064,533 | 12/1977 | Lampe et al. | 358/213 |
| 4,242,599 | 12/1980 | Suzuki | 358/213 |
| 4,316,221 | 2/1982 | Swab | 358/213 |
| 4,430,672 | 2/1984 | Berger | 358/213 |
| 4,443,818 | 4/1984 | Ohba et al. | 358/213 |
| 4,443,886 | 4/1984 | Matsumoto et al. | 377/58 |
| 4,506,299 | 3/1985 | Berger et al. | 358/213 |
| 4,528,595 | 7/1985 | Eouzan | 358/213 |

Primary Examiner—Gene Z. Rubinson
Assistant Examiner—Stephen Brinich
Attorney, Agent, or Firm—Joseph S. Tripoli; George E. Haas; Allen L. Limberg

[57] ABSTRACT

An infrared charge-coupled-device (IR-CCD) imager uses an array of Schottky-barrier diodes (SBD's) as photosensing elements and uses a charge-coupled-device (CCD) for arranging charge samples supplied in parallel from the array of SBD's into a succession of serially supplied output signal samples. Its sensitivity to infrared (IR) is improved by placing bias charges on the Schottky barrier diodes. Bias charges are transported to the Schottky barrier diodes by a CCD also used for charge sample read-out.

4 Claims, 5 Drawing Figures

CCD IMAGER WITH PHOTODETECTOR BIAS INTRODUCED VIA THE CCD REGISTER

The invention described herein was made in performance of work under NASA Contract No. NAS 5-27800 and is subject to the provisions of Section 305 of the National Aeronautics and Space Act of 1958 (72 Stat. 435; 42 U.S.C. 2457).

The present invention relates to arrays of Schottky barrier diodes (SBD's) used as photo sensors for sensing infrared (IR), the resultant charge samples developed by the diodes being arrayed for serial read-out in time by a charge-coupled-device (CCD)—that is, to IR-CCD imagers and, more particularly, to ones with improved sensitivity to IR.

BACKGROUND OF THE INVENTION

Measurements by the inventor's co-workers on IR-CCD imagers of the focal-plane-array (FPA) type, which employ platinum-silicide-silicon Schottky barrier diodes as photosensors, have proven that imager sensitivity to IR is increased by applying an IR bias to the imager prior to the transfer of charge samples from the SBD's to the CCD portion of the imager. Arrangements for applying such IR bias in a working camera tend to be impractical, however.

The IR bias generates charge carriers by photoconversion that fill surface traps and provide what is essentially the equivalent of a fat zero bias charge for the charge transfer process that removes charge packets accumulated in the photodetectors. These charge packets are then conveyed by charge-coupled-device shift registers to the imager output. It is proposed to introduce bias charges into the photodetector SBD's by charge transfer, rather than by photoconversion.

SUMMARY OF THE INVENTION

The present invention is embodied in an infrared imager in which the CCD shift registers, used in the process of conveying to the imager output the charge packets accumulated in the photodetectors, are put to use in placing bias charges into the photodetectors. This allows small IR responses to be completely flushed from those photodetectors in the ensuing charge transfer process. The IR responses are superposed on a fat zero bias charge to facilitate the efficient charge transfer of small IR responses to the imager output.

DETAILED DESCRIPTION

Figure 1:
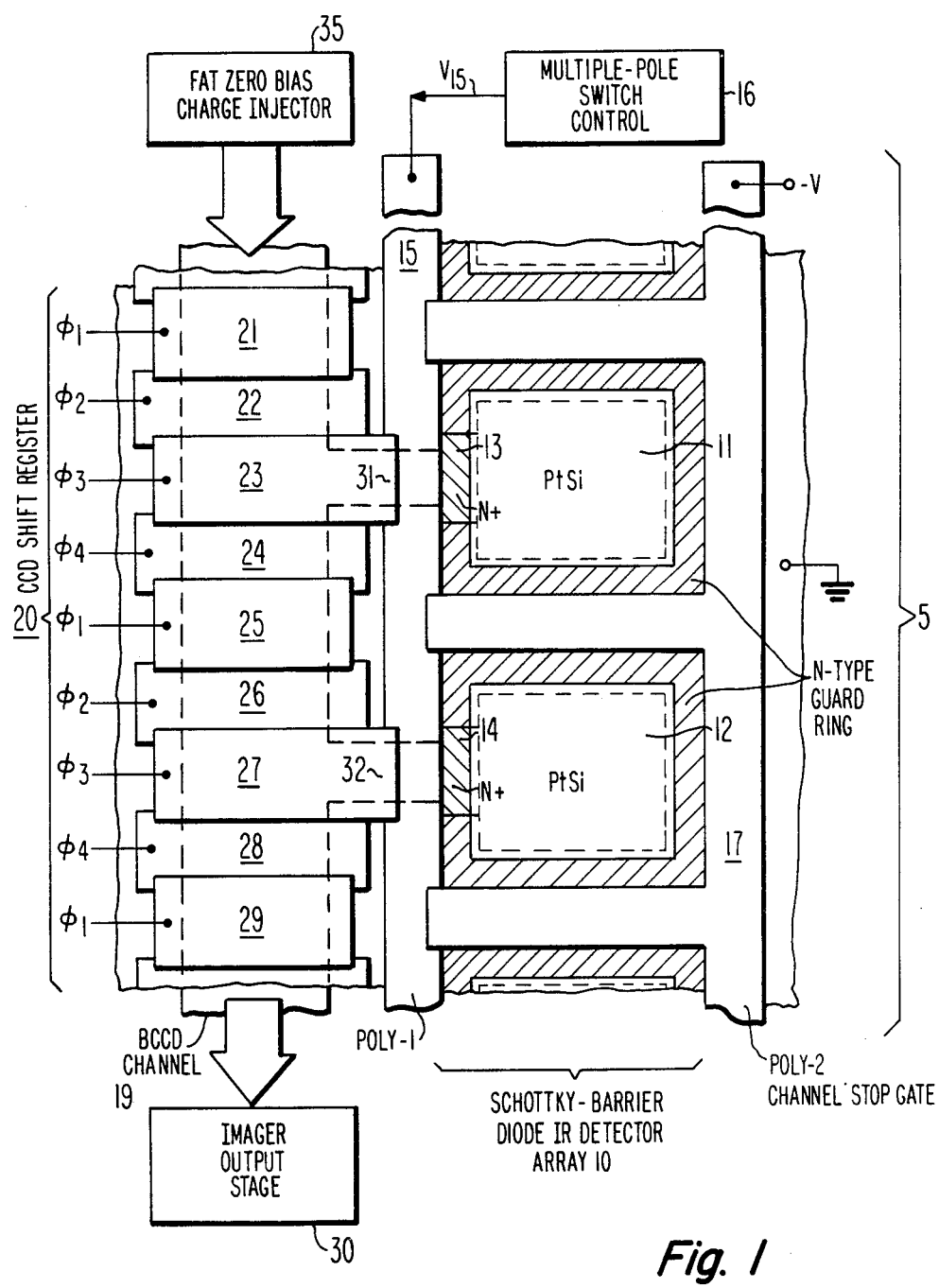
FIG. 1 is a schematic diagram of an infrared focal plane array/charge-coupled device (IRFPA/CCD) imager using Schottky barrier diode (SBD) radiation detector elements in linear array for sensing infrared radiation, which imager differs from prior art imagers in that the clocking and switch control signals applied to it introduce fat zero bias charges into the SBD's in accordance with the invention.

FIG. 1 shows a stylized representation of a portion 5 of a semiconductor imager of the infrared focal plane array, charge-coupled-device type. Such an imager is commonly constructed on a monolithic silicon substrate. FIG. 1 presents portion 5 of such an imager, assuming one to be viewing the "top" surface of the substrate, on which surface CCD gate electrode structures and Schottky barrier diode structures are disposed. IRFPA/CCD imagers conventionally receive IR radiation from a direction such that it first impinges upon the top surface of the imager. Gate electrode structures 15, 22, 24, 26, 28 repose in a first polysilicon layer; gate electrode structures 17, 21, 23, 25, 27, 29, in a second polysilicon layer. The semiconductor imager includes at least one linear array 10 of Schottky barrier diode infrared detector elements; a plurality of paralleled straight-line linear arrays are customary in a planar array of radiation detector elements. Linear array 10 is shown in FIG. 1 to include Schottky barrier diode structures having "metal" (typically, platinum silicide or palladium silicide) cathodes 11 and 12 and the p-type substrate as a shared anode. The diode structures in line array 10 are for the most part surrounded by n-type guard rings indicated by lower-left to-upper-right diagonal shading. That is, except at the left where n+ type diffusions, 13 and 14 indicated by upper-left-to-lower-right diagonal shading, are placed to ohmically contact cathodes 11 and 12 to offshoots 31 and 32 of a buried CCD channel 19. The guard ring and ohmic contacts 13, 14 etc. extend under the edges of the metal cathodes 11, 12 etc. as indicated by the dashed lines in the peripheral portions of the cathodes. A first-layer-polysilicon gate electrode structure 15 responds to potential pulses supplied by a multiple-pole switch control 16 to selectively reduce a barrier potential induced in the semiconductor substrate at the left sides of the diode structures in array 10. A second-layer-polysilicon gate electrode structure 17 is biased (by means now shown) to provide channel stop between the diode structures in array 10 and along the right sides of those structures.

At the left of FIG. 1 a CCD shift register 20 is shown. This comprises a biased charge-coupled-device channel 19 running top to bottom of imager portion 5 and a succession of gate electrode structures alternately in the first polysilicon layer and in the second polysilicon layer, of which gate electrode structures 21–29 are representative. By way of example these CCD gate electrode structures 21–29 have clocking signals selectively applied to them in four phases $\phi_1, \phi_2, \phi_3, \phi_4$, to transfer charge packets towards the bottom of CCD shift register 20 for application to the imager output stage 30. The boundaries of BCCD channel 19 and of its offshoot BCCD channels 31, 32 are shown by dashed line. These boundaries are conventionally defined by the edges of channel stops, as may be provided by the p-type substrate in which the BCCD channels repose. (Alternatively or additionally, where three-layer-polysilicon fabrication is used, gate structures for establishing channel stop regions by electrostatic induction may be placed in the first polysilicon layer; and the gate structures shown in first and second polysilicon layers in FIG. 1 may instead respectively repose in the second and third polysilicon layers.)

BCCD channel 19 has offshoot charge transfer channels 31, 32 etc. to facilitate selective transferal of charge packets, which have been respectively accumulated in Schottky barrier diode structures of array 10 responsive to impinging IR, to positions in BCCD channel 19. Such transfers are made when switch control 16 pulses gate electrode 15 to lower barrier potential in offshoot channels 31, 32 etc.; during this time forward clocking of CCD register 20 is usually halted momentarily. In any case, the gate electrode structures in CCD register 20 which span main charge transfer channel 19 where offshoot charge transfer channels 31, 32 etc. join it, are conditioned to induce electric field conditions in channel 19 that facilitate charge transfer from the Schottky barrier diodes of array 10. Here, those gate electrode structures 23, 27 etc. have clock phase $\phi_3$ applied to them; and $\phi_3$ is made positive during charge transfer.

The charge packets transferred from Schottky barrier diodes in array 10 are often much less than "full-well". To reduce the lag characteristic of the transfer of such small charges and to promote charge transfer efficiency within CCD shift register 20, the charge packets after their transferral from the diodes have been superposed on bias charges of the predetermined level, commonly referred to as "fat zero" charge packets. A low-noise charge injector 35 at the end of CCD shift register 20 opposite imager output stage 30 injects a fat zero each cycle of the forward clocking of shift register 20 as charge packets transferred from diodes in array 10 are clocked to imager output stage 20. (A suitable low-noise charge injector is described by W. F. Kosonocky in U.S. Pat. No. 3,986,198 issued Oct. 12, 1976 and entitled "INTRODUCING SIGNAL AT LOW NOISE LEVEL TO CHARGE-COUPLED CIRCUIT".) A succession of fat zero charge packets fills the positions in shift register 20 left vacant by charge packets responsive to IR detection as they transfer forward. So, when the last charge packet responsive to IR detection has been transferred from CCD shift register 20 to imager output stage 30, CCD shift register 20 contains fat zero charge packets on which charge packets accumulated in the Schottky barrier diodes of array 10 can be superposed.

The operation thusfar described is in accordance with prior art practice. The present invention departs from this practice by introducing further steps of operation. The fat zero charge packets left in CCD shift register 20 at the finish of the process of read-out to output stage 30 are transferred into the Schottky barrier diodes in array 10 to provide bias for these photodetectors themselves; and the resulting charge packets in each of which photoresponse charge is superposed on fat zero charge are then transferred from the diodes in array 10 to the CCD shift register 20. These charge packets, enlarged by respective fat zero charges, are transferred with greater efficiency and less lag than would be the case if they were not so enlarged by fat zero charges.

Figure 2:
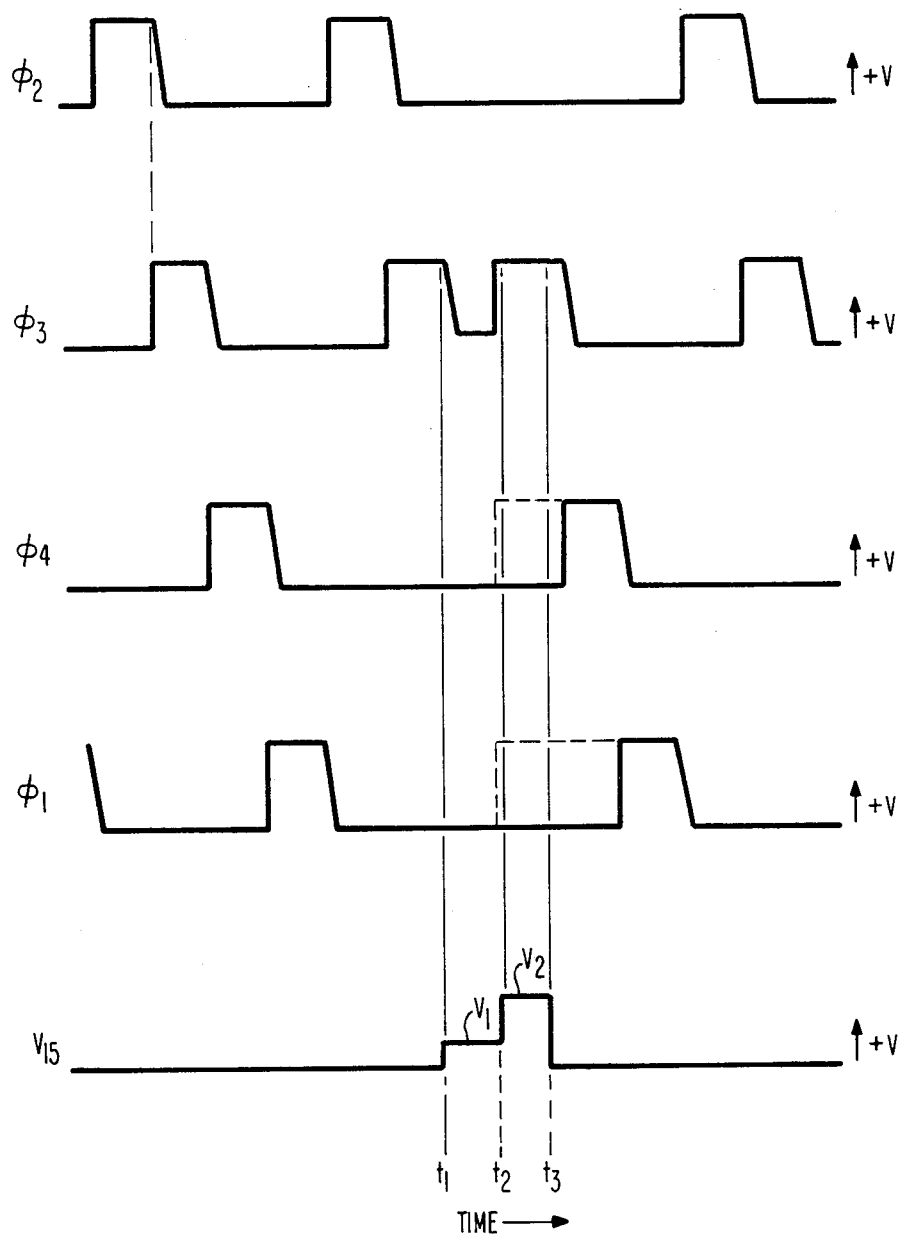
FIG. 2 is a clocking diagram showing clocking and switch control signals applied to the FIG. 1 imager to cause it to exhibit improved sensitivity and reduced lag in accordance with the invention.

FIG. 2 is a clocking diagram showing the $\phi_1$, $\phi_2$, $\phi_3$, $\phi_4$, clocking voltages applied to CCD shift register 20 at the close of the forward charge transfer interval ending at time $t_1$ (when fat zero charge packets occupy positions under all $\phi_3$ gates), during the interval between times $t_1$ and $t_2$ when fat zero bias charge packets are transferred into the Schottky barrier diodes of array 10 to merge with accumulated photoresponse, during the interval between times $t_2$ and $t_3$ when charge packets descriptive of accumulated photoresponse superposed on fat zero are transferred from the Schottky barrier diodes of array 10 into CCD shift register 20, and during the interval after time $t_3$ when forward charge transfer in CCD register 20 is resumed. The potential on the transfer gate 15 during these times is also shown. As shown by dashed line, $\phi_1$ clock signal, or $\phi_4$ clock signal, or both $\phi_1$ and $\phi_4$ clock signals may be held high at times preceding $t_2$ until the times these clock signals are normally high, to provide increased charge handling capacity in shift register 20 during the transfer of charge from the SBD's in array 10.

Figure 3:
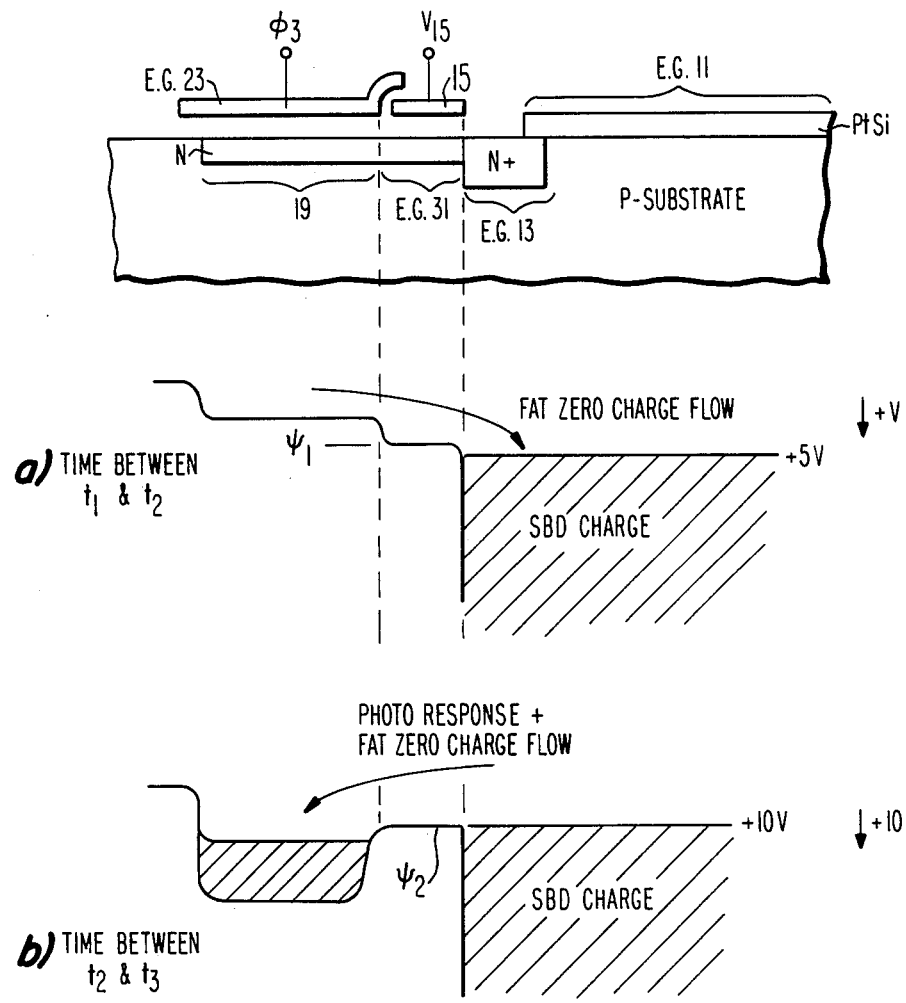
FIG. 3 is a charge profile diagram showing (a) the transfer of fat zero bias charge into an SBD of FIG. 1 imager and (b) the subsequent transfer of SBD photoresponse superposed on fat zero bias charge, from the SBD into the charge-coupled-device (CCD) shift register used in the commutation of SBD photoresponse to the imager output stage, which charge transfers are made in accordance with the invention.

FIG. 3 shows the charge profiles (a) at a time between $t_1$ and $t_2$ and (b) at a time between $t_2$ and $t_3$, spatially aligned under the profile of the typical offshoot charge transfer channel (e.g., 31 or 32). Between times $t_1$ and $t_2$ (as one may see referring back to FIG. 2) the $\phi_3$ clocking signal is only so positive that a shallow potential energy well is induced under each of the $\phi_3$ gate electrodes 23, 27 etc., a well at higher potential energy level than the associated SBD in array 10. The flanking $\phi_1$ and $\phi_4$ gate electrodes are relatively negative, sufficiently so to keep the fat zero charge under the $\phi_3$ gate electrode. Gate electrode 15 potential $V_{15}$ is raised to a voltage $V_1$ to reduce the barrier potential $\psi_1$ induced under gate electrode 15 sufficiently that the fat zero charge packets flow from under the $\phi_3$ gate electrodes 23, 27 etc. to their corresponding SBD's in array 10.

Between times $t_2$ and $t_3$ gate electrodes (as one may see referring back to FIG. 2) are returned to the normal clocking voltage levels associated with forward charge transfer in CCD shift register 20. The potential energy well under the $\phi_3$ gate electrode is full depth. Transfer gate electrode 15 has a voltage $V_2$, corresponding to a channel potential $\psi_2$ more positive than $\psi_1$, applied to it to lower even further the potential energy barrier thereunder. This allows the fat zero bias charge and accumulated photoresponse charge superposed thereon to flow from the SBD cathode to under the $\phi_3$ gate electrode, which process resets the Schottky barrier electrode to potential $\psi_2$.

While a barrier-channel transfer gate 15 has been described, the invention will work with a surface-channel transfer gate instead. It will even work if the barrier channel terminates under the transfer gate (15) and there is an extension of the offshoot channel to a surface channel under the transfer gate. In such use though, there will be trapping of some portion of the fat zero bias charge under the buried-channel portion of the transfer gate during charge flow into the SBD. This trapped charge will be recovered when charge flow is back into CCD shift register 20. The channel stops which define the boundaries of the surface-channel offshoot charge transfer channels (replacing the BCCD offshoot channels 31, 32 etc.) are provided by p+ diffusions or by appropriately biased gate electrode structures in a polysilicon layer underlying those in which gate electrodes 21-29 and a transfer gate electrode 15 are formed. BCCD offshoot channels under transfer gate 15 are preferred in that they eliminate a possible source of charge partitioning noise. On the other hand surface charge transfer channel under transfer gate 15 provides inherent anti-blooming protection.

Figure 4:
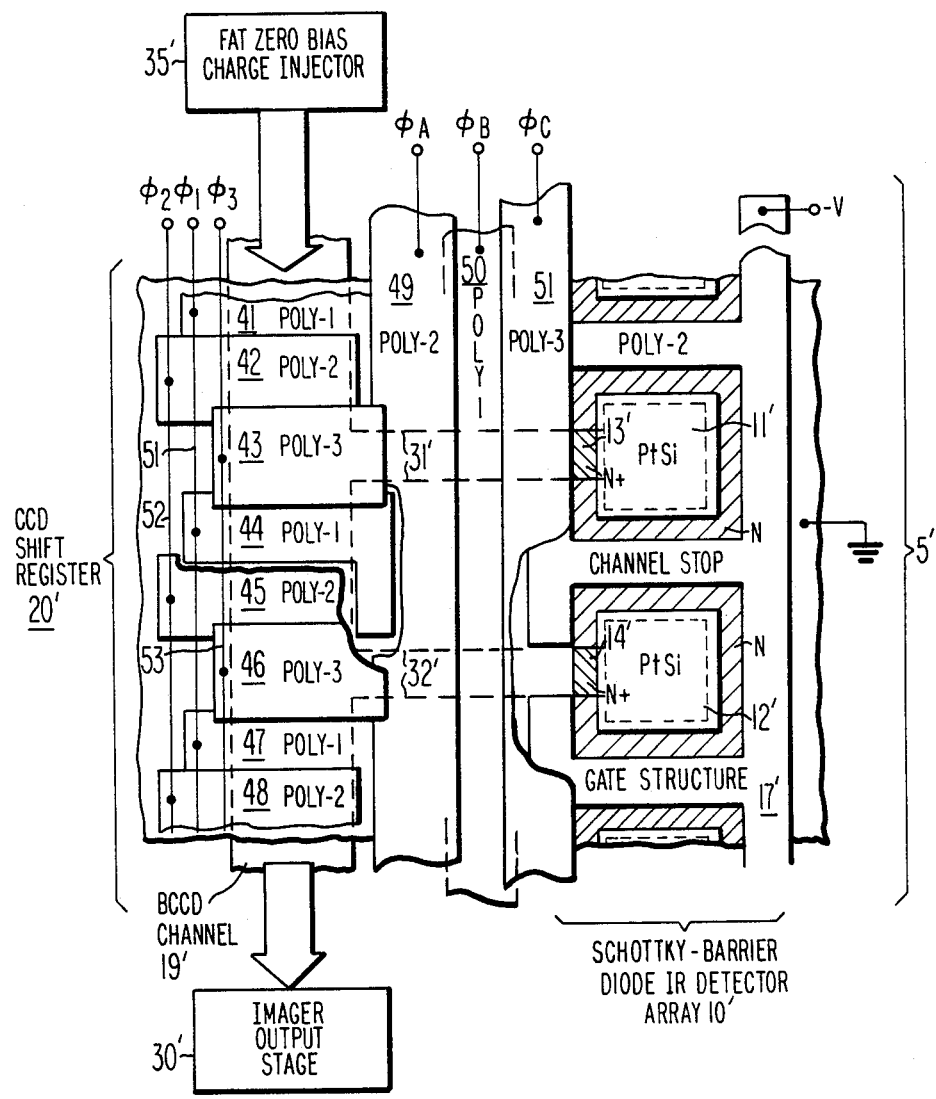
FIG. 4 is a schematic diagram of an IRFPA/CCD imager with auxiliary CCD shift register connection (rather than single transfer gate connection as in FIG. 1) between each SBD in the linear array and the CCD shift register used for parallell-to-series conversion, differing from the art in the reversible clocking of those auxiliary CCD shift register connections to introduce fat zero bias charges into the SBD's in accondance with the invention.

FIG. 4 illustrates how each of the offshoot charge transfer channels 31', 32' etc. of the charge transfer channel 19' of a CCD shift register 20' reading out photoresponse from an array 10' of SBD's may be arranged to operate, not with a single transfer gate 15 as in FIG. 1, but rather as an auxiliary CCD shift register with a plurality of overspanning gate electrodes. These gate electrodes are clocked to transfer fat zero bias charge packets into the SBD's between a time $t_4$, when fat zero charge packets are disposed under all $\phi_3$ gate electrodes in the CCD shift register 20', and a later time $t_6$. The gate electrodes in the auxiliary CCD shift register are then clocked in reverse sequence from time $t_6$ through time $t_7$ to transfer photoresponse charge superposed on fat zero bias charge from the SBD's back into CCD shift register 20'.

Figure 5:
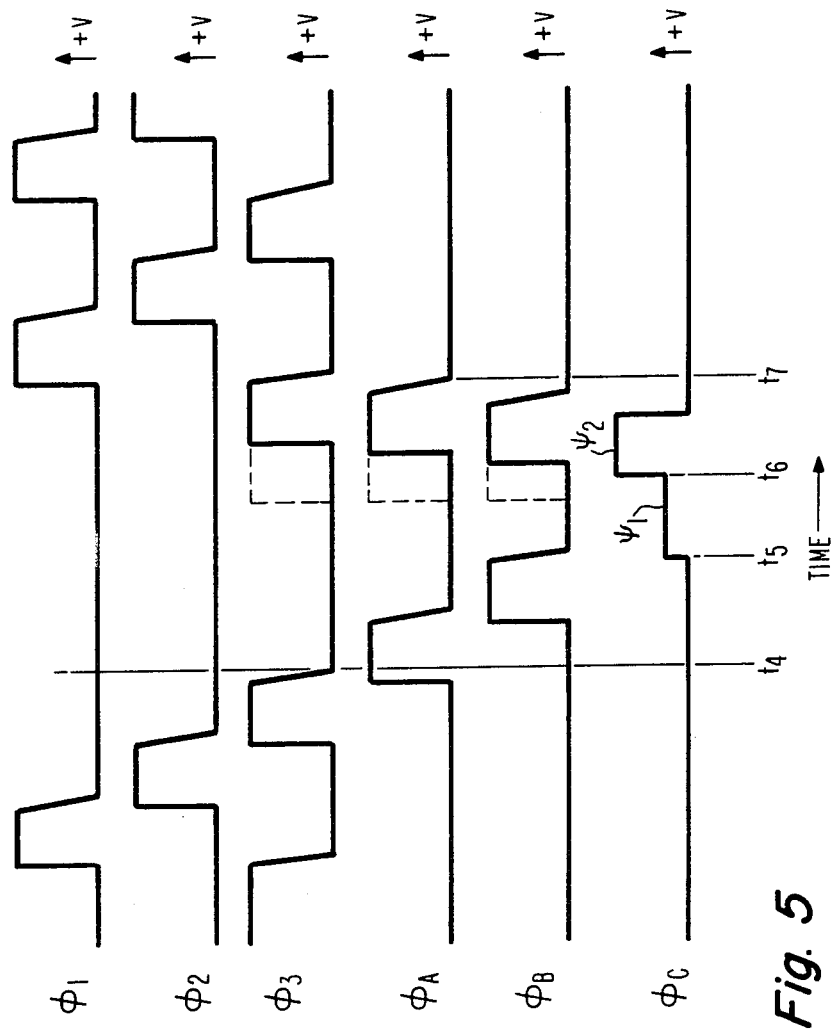
FIG. 5 is a clocking diagram of the FIG. 4 imager.

FIG. 5 is a clocking diagram of the operation of the FIG. 4 imager. The imager is clocked three-phase during normal forward charge transfer through CCD shift register 20'. The gate electrodes overspanning BCCD channel 19' of shift register 20' that are receptive of each of successive clock phases $\phi_1$, $\phi_2$, $\phi_3$ repose in respective layers of polysilicon. Gate electrodes 41, 44, 47 etc. in the first polysilicon layer are shown connected by top metalization 51 to receive $\phi_1$ clock signal. Gate electrodes 42, 45, 48 etc. in the second polysilicon layer are shown connected by top metalization 52 to receive $\phi_2$ clock signal. The $\phi_1$ and $\phi_2$ clock signals are suspended in the low state from time $t_4$ to $t_7$ as maybe seen in FIG. 5 clocking diagram. Gate electrodes 43, 46 etc. are in the third polysilicon layer and are shown connected by top metalization 53 to receive $\phi_3$ clocking signal.

Three gate electrode structures 49, 50, 51 located in the second, first and third polysilicon layers, respectively, run from top to bottom of portion 5 of the FIG. 4 imager and of its preceding and succeeding portions. These gate electrode structures 49, 50, 51 overspan the offshoot charge transfer channels 31', 32' etc. and receive clocking signals $\phi_A$, $\phi_B$ and $\phi_C$ respectively.

Gate electrode 51 is cut away where it overspans offshoot BCCD channel 32' to show how the channel stop gate structure 17' wraps around the right side of the n-type guard ring of each of the SBD's of array 10. Gate structure 17' may as an alternative be in the first, rather than the second, layer of polysilicon. Gate electrodes 45, 46 and 49 are cut away to reveal first-layer-polysilicon gate electrode 44 more fully. Gate electrode 44 (or its like 41, 47 etc.) hooks downward at its right end past the channel stop edge defining the right side of BCCD channel 19' to bias the semiconductor substrate between adjoining second-layer polysilicon gate electrodes 49 and 45 (or its like 42, 48, etc.). While the channel stop structure (not specifically shown) is presumed to be formed by p diffusions in FIG. 4, structural variations which permit the channel stops to be induced by gate electrode structures in the first layer of polysilicon are possible (e.g., by transposing each of the polysilicon structures shown up one layer, the last layer being in a fourth polysilicon layer or in top metalization such as aluminum).

During the normal forward clocking of CCD shift register 20' prior to time $t_4$ and after $t_7$ clocking signals $\phi_A$ and $\phi_B$ are held negative so charge cannot transfer between the SBD's in array 10' and BCCD channel 19' of CCD shift register 20'. From time $t_4$ through $t_5$ clocking is such that $\phi_A$ continues clocking in $\phi_1$ phase and $\phi_B$ continues clocking in $\phi_2$ phase to transfer fat zero charges rightward from under $\phi_3$ gate electrodes 43, 46 etc. through a shallow potential energy well induced under gate electrode 51 into the SBD's of array 10'. From time $t_6$ to $t_7$ $\phi_C$, $\phi_B$, $\phi_A$ clocking is reversed in phase order to transfer charge packets leftward from the SBD's of array 10' into BCCD channel 19' of CCD shift register 20'.

Variants of the clocking procedures of FIGS. 2 and 5 are possible in which dynamic clocking is suspended for a time between introduction of fat zero bias charges into the SBD's and transfer of accumulated photoresponses superposed on fat zeroes from the SBD's.

A variety of other charge transfer structures for linear and planar arrays of photodetectors, each of which embodies the invention, will readily occur to one skilled in the art of CCD imager design and armed with this disclosure. This should be borne in mind when construing the scope of the claims which follow.

What is claimed is:

1. In a semiconductor imager including a linear array of photodetector diodes arranged to provide photoconversion to charge of radiation impinging thereon;
   a CCD shift register having a charge transfer channel between an input end thereof and an output end thereof, which charge transfer channel parallels said linear array of photodetector diodes and has respective offshoots facilitating connection with those photodetector diodes;
   an imager output stage for generating imager output signal responsive to charge packets supplied thereto from the output end of said CCD shift register;
   means for transferring at selected times, separated by image integration intervals, charge packets from said photodetector diodes to said charge transfer channel via its respective offshoots to them;
   means for forward clocking said CCD register during said image integration intervals to successively transfer to said imager output stage charge packets transferred into respective successive stages thereof from said photodetector diodes; and
   means for improving the charge transfer efficiency of charge transfer from said photodetector diodes to said charge transfer channel, comprising:
   means for transferring respective bias charge packets into said photodetector diodes to augment charge accumulated from photoconversion, said transferring respective bias charge packets into said photodetector diodes being done prior to each said selected time of transferring charge packets from said photodetectors, thereby to cause at those selected times transferring of charge packets from said photodetector diodes each of which packets comprises charge accumulated from photoconversion superposed on bias charge.

2. An improved semiconductor imager comprising:
   a linear array of photodetector diodes arranged to provide photoconversion to charge of radiation impinging thereon;
   a CCD shift register having a charge transfer channel between an input end thereof and an output end thereof, which charge transfer channel parallels said linear array of photodetector diodes and has respective offshoots facilitating connection with those photodetector diodes;

an imager output stage for generating imager output signal responsive to charge packets supplied thereto from the output end of said CCD shift register;

means for transferring at said selected times, separated by image integration intervals, charge packets from said photodetector diodes to said charge transfer channel via its respective offshoots to them;

means for forward clocking said CCD register during said image integration intervals to successively transfer to said imager output stage charge packets transferred into respective successive stages thereof from said photodetector diodes;

means for injecting fat zero charge packets into the input end of said CCD shift register during its forward clocking; and means for improving the charge transfer efficiency of charge transfer from said photodetectors to said charge transfer channel, which means comprises means for transferring into said photodetector diodes as bias charge packets, before each of said selected times, respective ones of the fat zero charge packets then reposing in the stages of said CCD shift register, to augment charge accumulated from photoconversion prior to each selected time of transferring charge packets out of said photodetector diodes, thereby to cause at those selected times transferring of charge packets out of said photodetector diodes each of which packets comprises charge accumulated from photoconversion superposed on bias charge.

3. An improved semiconductor imager as set forth in claim 2 wherein each of said offshoots of said charge transfer channel has a transfer gate electrode disposed over it, to which potential is applied during the forward clocking of said CCD shift register that will induce a barrier to charge transfer through the offshoot of said charge transfer channel, to which potential is applied by said means for transferring fat zero charge packets into said photodetector diodes before each of said selected times that will partially reduce the barrier to implement transfer of the fat zero charge packet, and to which potential is applied by said means for transferring charge packets from said photodetector diodes that will further reduce the barrier to transfer of charge to implement transfer of the charge packet from the photodetector diode to which said offshoot connects; and wherein said means for transferring fat zero charge packets includes means for adjusting the potential energy level in said charge transfer channel so fat zero charge packets will transfer over said partially reduced barriers induced by potential on said transfer gate.

4. An improved semiconductor imager as set forth in claim 2 wherein each of said auxiliary offshoot channels is a portion of a respective auxiliary CCD shift register; wherein said means for transferring fat zero charge packets into said photodetector diodes before each of said selected times essentially consists of means for clocking said auxiliary CCD shift registers in a first direction selected to transfer fat zero charge packets into said photodetector diodes for time sufficient to effect those transfers; and wherein said means for transferring charge packets from said photodetector diodes during said selected times essentially consists of means for clocking said auxiliary shift registers in a second direction opposite the first for time sufficient to effect those transfers.

* * * * *